United States Patent [19]

Rugar et al.

[11] Patent Number: 5,266,896
[45] Date of Patent: Nov. 30, 1993

[54] MECHANICAL DETECTION AND IMAGING OF MAGNETIC RESONANCE BY MAGNETIC MOMENT MODULATION

[75] Inventors: Daniel Rugar, Palo Alto, Calif.; John A. Sidles, Seattle, Wash.; Costantino S. Yannoni, San Jose, Calif.

[73] Assignee: International Business Machines Corporation, Armonk, N.Y.

[21] Appl. No.: 896,026

[22] Filed: Jun. 9, 1992

[51] Int. Cl.$^5$ .............................................. G01V 3/00
[52] U.S. Cl. .................................... 324/307; 324/300
[58] Field of Search ............... 324/307, 309, 300, 310, 324/311, 312, 313, 318, 322; 128/653.5

[56] References Cited

U.S. PATENT DOCUMENTS

| | | | |
|---|---|---|---|
| 5,001,426 | 3/1991 | Frey et al. | 324/259 |
| 5,036,286 | 7/1991 | Holm-Kennedy et al. | 324/661 |
| 5,166,615 | 11/1992 | Sidles | 324/307 |

OTHER PUBLICATIONS

Sidles, "Noninductive Detection of Single-proton Magnetic Resonance", Applied Physics Letters, vol. 58, Jun. 17, 1991, pp. 2854-2856.
Garstens et al., "Low-field Magnetic Resonance", Physical Review, vol. 99, No. 2, pp. 459-463, Jul. 15, 1955.
Abragam, "The Principles of Nuclear Magnetism", Oxford Univ. Press, London, 1961, pp. 32-37, 65-71, and 86-87.
Sidles, "Folded Stern-Gerlach Experiment as a Means for Detecting Nuclear Magnetic Resonance in Individual Nuclei", Phys. Rev. Let., vol. 68, pp. 1124-1127.
S. Chiang et al., "Measurement of Magnetization or Magnetic Susceptibility of Small Particles and Measurement of Field Gradients of Domain Walls", IBM Tech. Disclosure Bulletin, vol. 30, No. 4, Sep. 1987.

*Primary Examiner*—Louis Arana
*Attorney, Agent, or Firm*—Henry E. Otto, Jr.

[57] ABSTRACT

Methods and apparatus for detecting (and, if desired, imaging) the effects of magnetic resonance in a spin-containing material by measuring the magnetic force acting on a mechanical cantilever having a low damping coefficient due to modulation of the magnetic moment of the material in the polarizing field direction at a frequency substantially lower than the spin resonance frequency. Modulation of the magnetic moment in the direction of the polarizing magnetic field may be achieved by modulating (i) the magnitude of the magnetic field in the polarizing direction or (ii) the frequency or amplitude of a high-frequency magnetic field.

25 Claims, 5 Drawing Sheets

MECHANICAL DETECTION AND IMAGING OF MAGNETIC RESONANCE BY MAGNETIC MOMENT MODULATION

FIELD OF THE INVENTION

This invention relates to methods and apparatus for detecting and imaging magnetic resonance effects by measuring magnetically-induced mechanical forces acting on a mechanical oscillator, and more particularly relates to methods and apparatus for detecting and imaging such effects by modulating the magnetic moment of the material along the polarizing field direction at a frequency substantially lower than the spin resonance frequency.

BACKGROUND OF THE INVENTION

The references known to applicants considered to be the most pertinent to the present invention are:

(A) Sidles, "Noninductive Detection of Single-proton Magnetic Resonance", Applied Physics Letters, Vol. 58, Jun. 17, 1991, pp. 2854-2856;

(B) Garstens et al., "Low-field Magnetic Resonance", Physical Review, Vol. 99, 1955, pp. 459-462; and (C) Abragam, "The Principles of Nuclear Magnetism", Oxford University Press, London, 1961, pp. 32-37, 65-71, and 86-87.

(D) Sidles, "Folded Stern-Gerlach Experiment As a Means for Detecting Nuclear Magnetic Resonance in Individual Nuclei", Physical Review Letters, Vol. 68, pp. 1124-1127.

References (A) and (D) described a method and apparatus for noninductively detecting the presence of nuclear magnetic resonance by coupling the nuclear spin of a particle to the motion of a mechanical oscillator, such as a quartz oscillator having two cantilevers shaped like a tuning fork. Coupling is achieved by applying a large-gradient magnetic field that exerts a mechanical force on the particle by virtue of its magnetic moment. The effectiveness of the coupling increases as the oscillator mass is decreased and the gradient length scale is made shorter. These references note that oscillator-based detection is only marginally effective for macroscopic samples, but is quite effective for single protons interacting with a micron-scale oscillator. They also suggest that magnetic resonance imaging may be possible on a molecular scale.

The mechanical cantilevers described in Reference (A) for use in molecular imaging have resonance frequencies that are designed to coincide with the resonant frequency of the precessing nuclear spins, which is typically in the range of 10-600 MHz. It is difficult to build a suitable mechanical cantilever with such high frequencies because, for molecular imaging, it is desirable that the cantilevers have a low spring constant in order to provide adequate force sensitivity. High resonant frequency and a low spring constant can be achieved only if the cantilevers have very low mass, which implies small physical size. Reference (A) proposes molecular imaging by the use of cantilevers with dimensions as small as 5 nanometers, which is too small for present-day micromechanical fabrication techniques.

The basic problem with direct mechanical detection of nuclear precessing spins in a spin resonance implementation, such as in Reference (A), is that the spin resonance frequency is inconveniently high. In nuclear magnetic resonance (NMR) and electron paramagnetic resonance (EPR), the spin resonance frequency $\omega_0$ is given by $\omega_0 = \gamma H_z$, where $\gamma$ is the gyromagnetic ratio and $H_z$ is the applied field used to polarize the sample (i.e., to create a difference in the energy and population of the parallel and anti-parallel spin states). For best sensitivity, $H_z$ is usually made as large as practical. Making $H_z$ large creates a desirably large net magnetic moment in the sample, but also makes the spin resonance frequency $\omega_0$ larger than is practical to detect mechanically. In ferromagnetic resonance (FMR), $H_z$ is an effective field that includes the effect of quantum mechanical exchange energy. In nuclear quadrupole resonance (NQR), spin state energy splitting is created by the interaction of the nuclear electric quadrupole moment with the gradient of the local electric fields in the molecule or crystal.

Reference (B) discusses the steady state behavior of magnetic resonance as a function of applied field and frequency; and, in particular, equation (11) on page 461 describes the behavior of $M_z$, the magnetization in the z direction.

Reference (C) is a text describing the general principles of NMR and the specific pages cited disclose various techniques for modulating the magnetization, including magnetization in the z direction ($M_z$). These techniques include adiabatic fast passage, transient nutation, and the application of high-frequency pulses.

There is a need for an alternative magnetic force detection method and apparatus which (1) does not require a cantilever or cantilevers to have a resonant frequency equal to the frequency of the precessing spins, thereby permitting use of cantilevers with low-resonant frequency (e.g., 1-10,000 kHz) that are commercially available; (2) is suitable for all types of magnetic resonance, including NMR, EPR, FMR, NQR, antiferromagnetic resonance, and ferrimagnetic resonance; and (3) is useful for magnetic resonance force microscopy (e.g., for high-resolution imaging of molecules or imaging below surfaces with good resolution and the ability to evaluate the type of material by nuclear magnetic resonance spectroscopy, such as for nondestructive imaging of biological cells or of fully encapsulated integrated circuits.)

SUMMARY OF THE INVENTION

Methods and apparatus are disclosed for detecting and, if desired, imaging magnetic resonance effects in a material containing magnetic spins. A magnetic tip or a magnetic particle located in close proximity to the material creates a magnetic field gradient that exerts a force between the material and tip or particle, one or the other of which is mounted on a mechanical oscillator, such as a cantilever. The spins are polarized to create a magnetic moment in the material in the direction of the polarizing field, and a high-frequency magnetic field is applied to the material at a frequency substantially equal to the spin resonance frequency. The magnetic moment is modulated at a frequency $\omega_{mod}$ that is substantially lower than the spin resonance frequency to create a mechanical force that vibrates the oscillator at a frequency substantially lower than the spin resonance frequency. This vibratory motion of the oscillator is sensed. The material can be mechanically scanned relative to the magnetic particle or magnetic tip to image the spin resonance properties of the material. Various methods are disclosed for modulating the magnetic moment by modulating the magnetic field or the frequency or amplitude of a high-frequency magnetic field.

DESCRIPTION OF THE PREFERRED EMBODIMENTS

In the following description, the direction of the polarizing field, whatever its origin, will be designated as the z-direction; and the polarizing field will be designated as $H_z$, even though this is only an effective field for the case of FMR, and is really electrostatic in origin in the case of NQR.

In the presence of a polarizing field $H_z$, the magnetic moment of the electrons or nuclei will precess about $H_z$, giving rise to components of magnetization in the x-y plane ($M_x$ and $M_y$) which oscillate at the spin resonance frequency $\omega_0$. Reference (A) proposed to detect these rapidly oscillating components of magnetization ($M_x$, $M_y$). By contrast, in the technique according to the invention, the magnetization $M_z$, which does not oscillate at such high frequencies, is mechanically detected. Various modulation techniques are described which can create significant changes in the value of $M_z$ at frequencies lower than the spin resonance frequency $\omega_0$.

Figure 1A:
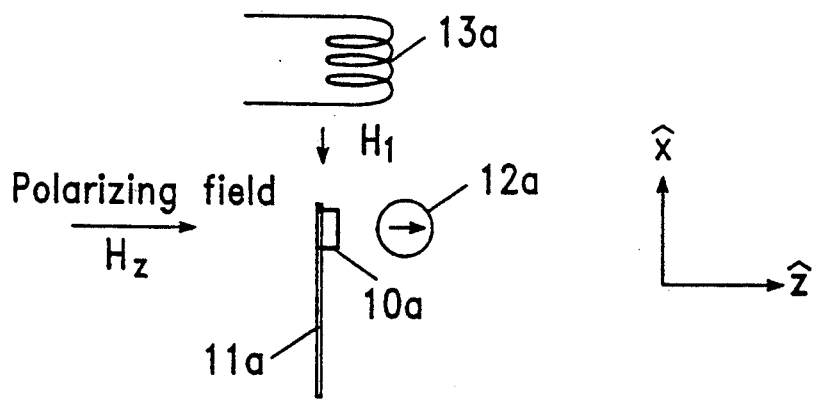
FIGS. 1A, 1B, and 1C depict various configurations for detecting changes in magnetization of a sample by measuring the mechanical force exerted on a nearby magnetic particle while the particle is subjected to spin resonance excitation.
Figure 1B:
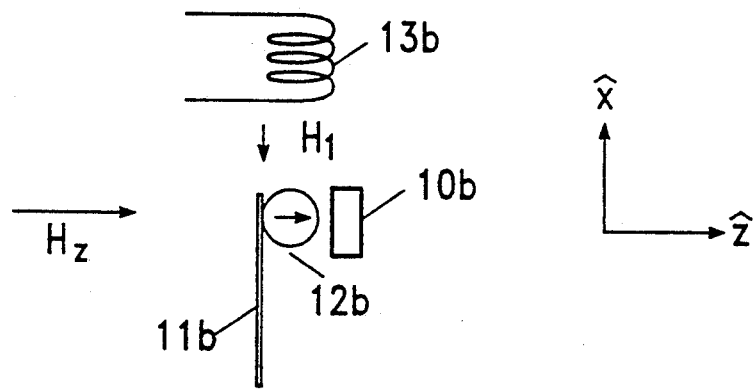
Figure 1C:
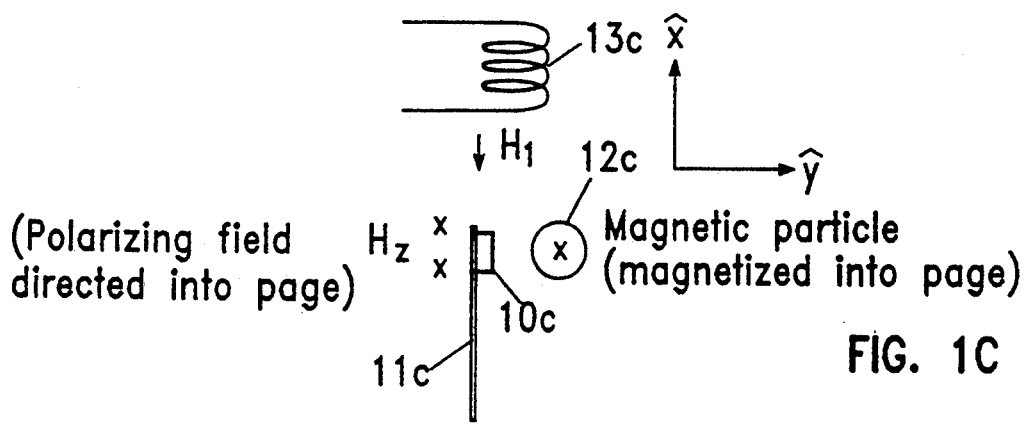

FIGS. 1A, 1B, and 1C depict various configurations by which changes in magnetization of a sample can be detected by means of the force exerted on a nearby magnetic body, such as a permanently magnetized tip or a small ferromagnetic spherical particle that is magnetized by the polarizing field $H_z$. FIG. 1A shows a sample 10a attached to a cantilever spring 11a and a magnetic particle 12a spaced therefrom, with the field $H_z$ directed along the plane of the paper. FIG. 1B shows a permanently magnetized body or particle 12b mounted on a cantilever spring 11b and spaced from a sample 10b. FIG. 1C shows a sample 10c mounted on cantilever spring 11c and spaced from a particle 12c with the field $H_z$ directed into (rather than along) the plane of the paper; i.e., orthogonally to that in FIG. 1A. In each case, spins in the sample are excited by a high-frequency magnetic field $H_1$ generated by a nearby high-frequency field coil 13a, 13b, or 13c. The magnetic field from the high-frequency field coil 13a, 13b, or 13c is directed perpendicular to $H_z$.

It will be understood that the orientation of the cantilever may be freely chosen, such that the force $\vec{F}$ exerted on the cantilever has a component parallel to the axis of cantilever motion.

The force $\vec{F}$ on the cantilever is generated due to the magnetic field gradient (i.e., nonuniform field) from the magnetic body acting on the magnetization of the sample. The force is given by $$\vec{F} = (\vec{m} \cdot \nabla) \vec{H}_2 \qquad (1)$$

where $\vec{H}_2$ is the field from the magnetic body and $\vec{m}$ is the total magnetic moment of the sample. As a result of the polarizing field, the sample will have an average magnetic moment in the z direction given by $\vec{m} = \hat{z} M_z V$, where V is the relevant volume of the sample. (The components $M_x$ and $M_y$ average to zero in the presence of a polarizing field because of the rapid precession.) Using the fact that curl $\vec{H}_2 = 0$, equation (1) can then be written $$\vec{F} = M_z V \nabla H_{2,z}.$$

For FIGS. 1A and 1B, the gradient of $H_{2,z}$ is in the z direction; thus, $\vec{F}$ is in the z direction and given by $$\vec{F} = \hat{z} M_z V \frac{\partial H_{2,z}}{\partial z} ; \qquad (2)$$

whereas for FIG. 1C, the gradient of $H_{2,z}$ is in the y direction; thus, $\vec{F}$ is in the y direction and is given by $$\vec{F} = \hat{y} M_z V \frac{\partial H_{2,z}}{\partial y} . \qquad (3)$$

The force $\vec{F}$ can be detected by measuring the mechanical motion of the cantilever. The cantilever motion can be converted into an electrical signal using any of a variety of transduction methods. Suitable transduction methods include interferometry, optical beam deflection, electron tunneling, piezoelectric effect, piezoresistive effect, etc.

The simplest, but least sensitive, method of detection is to measure the static (dc) deflection of cantilever 11a, 11b, or 11c (FIG. 1). A more sensitive method is to make use of the high-Q (high-quality factor) mechanical resonance of the cantilever. If the force $\vec{F}$ is made to oscillate with a frequency corresponding to the mechanical resonance frequency $\omega_c$ of the cantilever 11a, 11b, or 11c, then the amplitude of the cantilever displacement will be enhanced by the factor Q. The oscillation amplitude is given by $|\vec{F}|Q/k$, where k is the spring constant of the cantilever, and $|\vec{F}|$ is the magnitude of the oscillatory force. This oscillatory force can be created by modulating some parameter in the apparatus so as to create in the sample 10a, 10b, or 10c (FIG. 1) an oscillating magnetization $M_z$. Many methods exist for modulating $M_z$. Some will now be described.

(A) MODULATION USING QUASI-STEADY STATE METHODS

When only a polarizing field $H_z$ is acting on the sample, then the z-axis magnetization is given by $M_z = \chi_0 H_z$, where $\chi_0$ is the magnetic susceptibility of the spin system. When a high-frequency magnetic field $H_1$ is applied at right angles to the polarizing field and with a frequency $\omega_0$ chosen to be at resonance ($\omega_0 = \gamma H_z$), then $M_z$ can be suppressed. After a time much longer than the relaxation times, the suppression of $M_z$ can be calculated using the steady state solution to modified Bloch equations. Reference (B) describes the solution in analytical form to be $$M_z = \chi_0 \left[ H_z - \frac{\gamma^2 \omega^2 H_1^2 H_z \tau^4}{[1 + (\gamma H_z - \omega)^2 \tau^2][1 + (\gamma H_z + \omega)^2 \tau^2] + \frac{1}{2}\gamma^2 H_1^2 \tau^2 (1 + \omega^2 \tau^2 + \gamma^2 H_z^2 \tau^2)} \right] \quad (4)$$

where $\chi_0$ is the magnetic susceptibility, $\gamma$ is the gyromagnetic ratio, $H_1$ is the strength of the high-frequency magnetic field in the $\hat{x}$ direction, $H_z$ is the strength of the polarizing magnetic field, $\omega$ is the angular frequency of the high-frequency magnetic field, and $\tau$ is the relaxation time. The above expression assumes that $\tau = T_1 = T_2$, where $T_1$ and $T_2$ are the longitudinal and transverse relaxation times, respectively.

Figure 2:
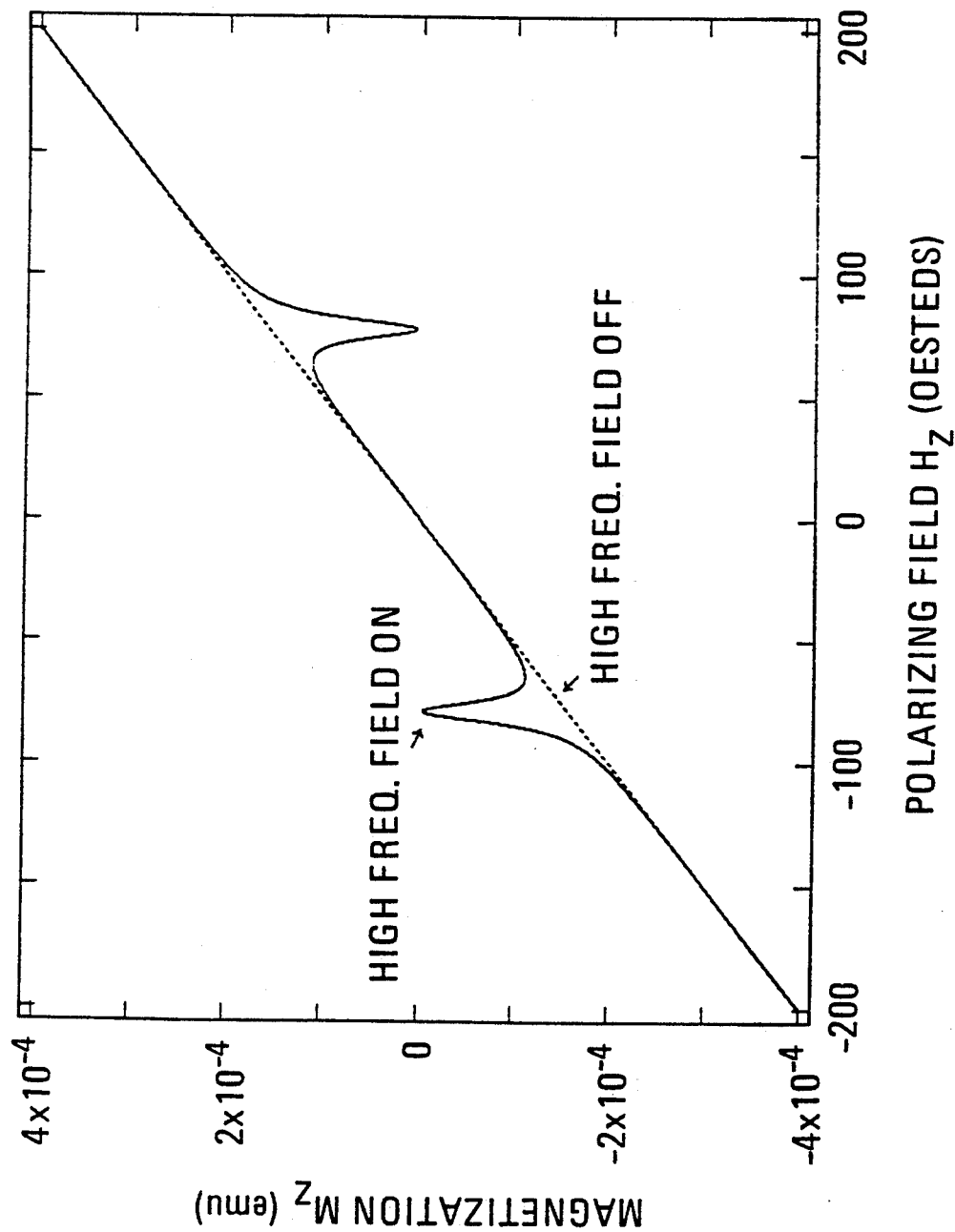
FIG. 2 is a plot of magnetization in the z-axis direction ($M_z$) vs. polarizing field $H_z$ for the cases where a high-frequency field is either off or applied with an amplitude of 10 gauss.

Equation (4) predicts the suppression of $M_z$ at resonance, as illustrated in FIG. 2, where $M_z$ is plotted as a function of polarizing field $H_z$. In FIG. 2, parameters suitable for electron paramagnetic resonance in diphenyl pycril hydrazil (DPPH) have been assumed; i.e., $\chi_0 = 2 \times 10^{-6}$, $\gamma = 1.76 \times 10^7 \text{ s}^{-1} \text{ gauss}^{-1}$, $\tau = 6.2 \times 10^{-8}$ sec and a high-frequency magnetic field frequency of 220 MHz ($\omega_0 = 1.38 \times 10^9 \text{ sec}^{-1}$). FIG. 2 shows that $M_z$ is sharply reduced when the polarizing field strength is at resonance ($H_z = \pm \omega_0/\gamma$).

Various methods can be used to modulate $M_z$ and thereby the magnetic moment created by the polarizing field $H_z$. These include (1) modulating the magnitude of $H_z$, (2) modulating the frequency of the high-frequency magnetic field $H_1$, or (3) modulating the amplitude of the high-frequency magnetic field $H_1$.

Assume now that $H_z$ is modulated according to $H_z = H_0 + H_{mod} \sin \omega_{mod} t$.

When $H_{mod}$ is small compared to $H_0$, the magnetization $M_z$ of the sample is given approximately by the Taylor series expansion $$M_z(t) = M_z(H_0) + \left[ \frac{\partial M_z}{\partial H_z} \right]_{H_z = H_0} H_{mod} \sin \omega_{mod} t +$$

$$\frac{1}{2} \left[ \frac{\partial^2 M_z}{\partial H_z^2} \right]_{H_z = H_0} (H_{mod} \sin \omega_{mod} t)^2,$$

or $$M_z(t) = M_z(H_0) + \frac{1}{2} H_{mod}^2 \left[ \frac{\partial^2 M_z}{\partial H_z^2} \right]_{H_z = H_0} +$$

$$\left[ \frac{\partial M_z}{\partial H_z} \right]_{H_z = H_0} H_{mod} \sin \omega_{mod} t -$$

$$\frac{1}{2} \left[ \frac{\partial^2 M_z}{\partial H_z^2} \right]_{H_z = H_0} H_{mod}^2 \cos 2\omega_{mod} t.$$

Figure 3:
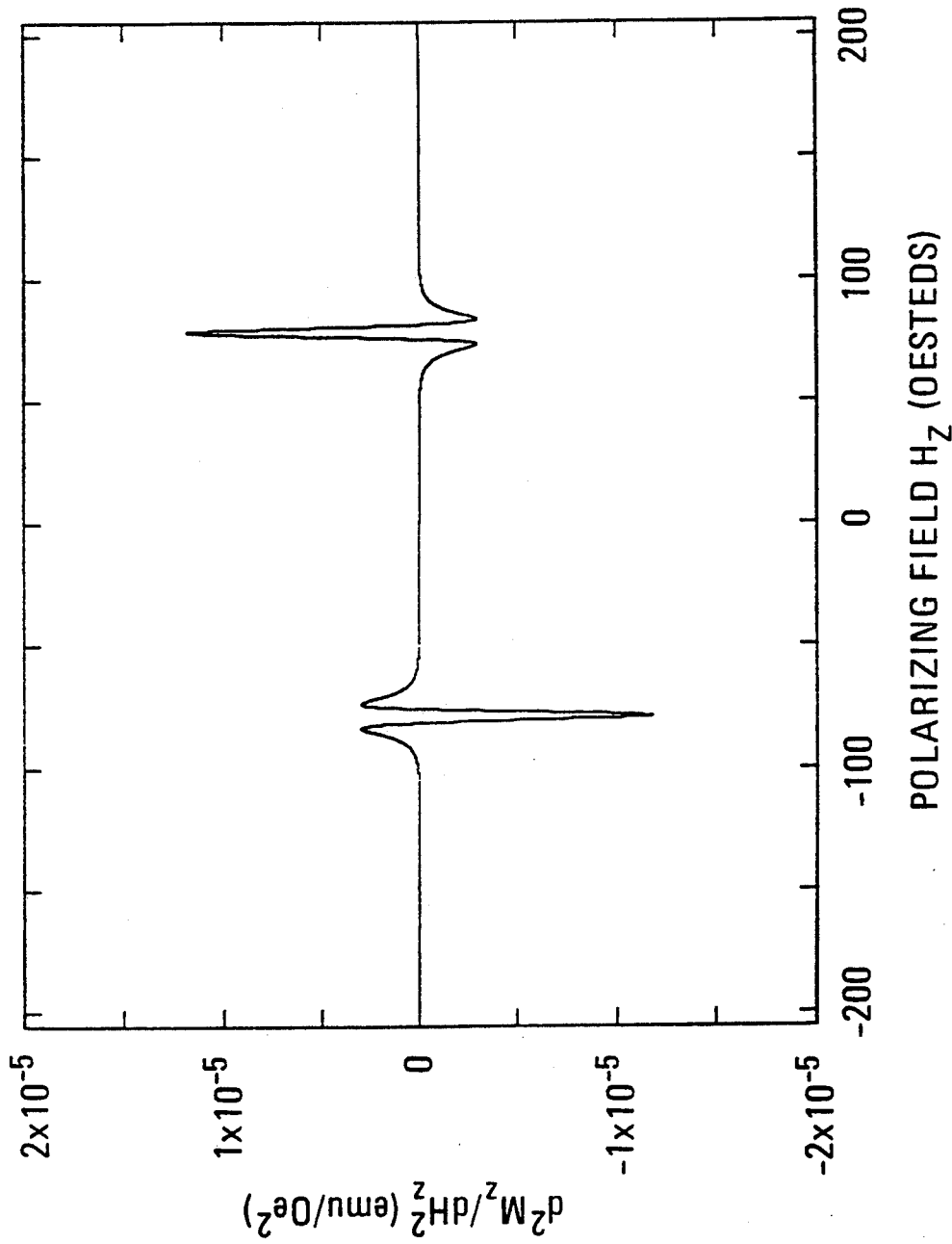
FIG. 3 is a plot showing the second derivative with respect to the polarizing field of the magnetization in the z-axis direction as a function of the polarizing field $H_z$.

It will thus be seen that modulation of the polarizing field $H_z$ gives rise to a dc term and a series of harmonics. For modulation at small amplitude, the strength of the first harmonic is proportional to the first derivative of $M_z$ with respect to $H_z$ and the second harmonic is proportional to the second derivative. FIG. 3 depicts the second derivative of the waveform illustrated in FIG. 2.

For most sensitive detection of the first harmonic term, the modulation frequency is chosen so that $\omega_{mod} = \omega_c$, where as earlier noted $\omega_c$ is the mechanical resonance frequency of the cantilever. However, detection of the second harmonic term has been found by actual test to be preferable, the modulation frequency in such case thus being $\omega_{mod} = \omega_c/2$.

(B) MODULATION USING TRANSIENT EFFECTS

When relaxation times are long compared to the modulation period, steady state solutions of the Bloch equations are not applicable and the transient behavior must be considered. Transient effects are discussed extensively in Reference (C). One transient method for reversing $M_z$ is "adiabatic fast passage". In this technique, which is preferred for modulating $M_z$ in nuclei, the polarizing field $H_z$ is initially larger than the resonant field (i.e., $H_z > \omega_0/\gamma$). The polarizing field is then reduced to a value less than the resonant field, causing the direction of the spins to reverse relative to the x-y plane. If the polarizing field is then returned to its original value, the direction of the spins will again invert so that the spins return to their original orientation.

If this modulation of the polarizing field above and below resonance is repeated cyclically with frequency $\omega_{mod}$, the magnetization will be cyclically inverted at frequency $\omega_{mod}$. This process may be termed "cyclic adiabatic inversion". For adiabatic inversion to occur, the applied high-frequency field $H_1$ must be sufficiently strong that $\omega_{mod} H_{mod}/H_1 << |\gamma H_1|$.

Reference (C) presents experimental results showing that, under proper conditions, nuclear spins may be cyclically inverted through many thousands of cycles without appreciable loss of magnetization. To avoid excessive loss of magnetization, it is necessary that $$T_1 \gtrsim \frac{2\pi N}{\omega_{mod}}$$

where $T_1$ is the spin-lattice relaxation time, and N is the number of cyclic inversions performed. This inequality expresses the requirement that spin-lattice relaxation occurs on time scales comparable to or longer than the total duration of the cyclic inversions.

It is also necessary that the applied high-frequency field $H_1$ be sufficiently strong such that $$|\gamma H_1| \gtrsim \frac{1}{T_2}$$

where $T_2$ is the spin-spin relaxation time. This inequality expresses the fact that the applied field must be strong enough to suppress relaxation due to spin-spin interactions. Typically, fields of $H_1 = 10$ gauss to $H_1 = 100$ gauss are strong enough to satisfy this requirement.

As described above, the polarizing field $H_z$ is cyclically modulated at a frequency $\omega_{mod}$ through values above and below resonance with the applied high-frequency field. However, cyclic adiabatic inversion may alternatively be accomplished by holding $H_z$ fixed, and cyclically modulating the frequency $\omega_0$ of the high-frequency field above and below resonance with $H_z$.

Another method for generating an oscillating $M_z$ is known as "transient nutation". As explained in Reference (C), this method involves applying polarizing field $H_z$ for a time greater than $T_1$, or indefinitely, and then suddenly applying a high-frequency magnetic field $H_1$ with a frequency chosen to be resonant with the spin precession. In the rotating frame, the spins will precess about the effective field, which is in the direction of $H_1$. This precessional (nutation) frequency about $H_1$ is much slower than the normal spin precession about $H_z$. The nutation frequency is given by $\omega_1 = \gamma |H_1|$ and $M_z$ will undergo an oscillation at this frequency. Since $H_1$ is much less than $H_z$, $\omega_1$ is much less than $\omega_0$.

Thus, stated differently, nutation involves high-frequency precession of the spins, where the angle of precession varies between one extreme above and the opposite extreme below the x-y plane, thus causing a modulation of the z component of spin magnetic moment. The rate of angular change during nutation is determined by the field strength $H_1$ of the high-frequency magnetic coil. A coil with field strength $H_1$ of 10 gauss corresponds to 43 kHz for protons, which is a frequency compatible with mechanical cantilevers.

Another method to modulate $M_z$ when relaxation times are long is to use a series of high-frequency magnetic pulses to periodically flip the polarity of $M_z$. These pulse, called "$\pi$" pulses in NMR literature, are created by applying the high-frequency magnetic signal for a duration $t_w = \pi/\gamma H_1$. "$\pi$" pulses are an essential and well-understood tool of modern NMR imaging devices.

Applicants' detection method and apparatus also are useful for magnetic resonance force microscopy (e.g., for high-resolution imaging of molecules or imaging below surfaces with good resolution and the ability to evaluate the type of material by nuclear magnetic resonance spectroscopy, such as for nondestructive imaging of biological cells or of fully encapsulated integrated circuits). The mechanical scanning technique would be somewhat analogous to that used in prior art atomic force microscopy or scanning tunneling microscopy.

The spatial resolution in one dimension is determined by the magnetic resonance linewidth divided by the gradient of the magnetic field. If the magnetic field gradient is generated by a 100 nm iron sphere, then the magnetic field gradient can be as large as $|\partial H_z/\partial z| = 10$ gauss per nanometer. If the resonance linewidth $\Delta H = 1$ gauss, then the resolution in the z direction is $\Delta z = \Delta H/|\partial H_z/\partial z| = 0.1$ nanometers.

(C) APPARATUS

Figure 4:
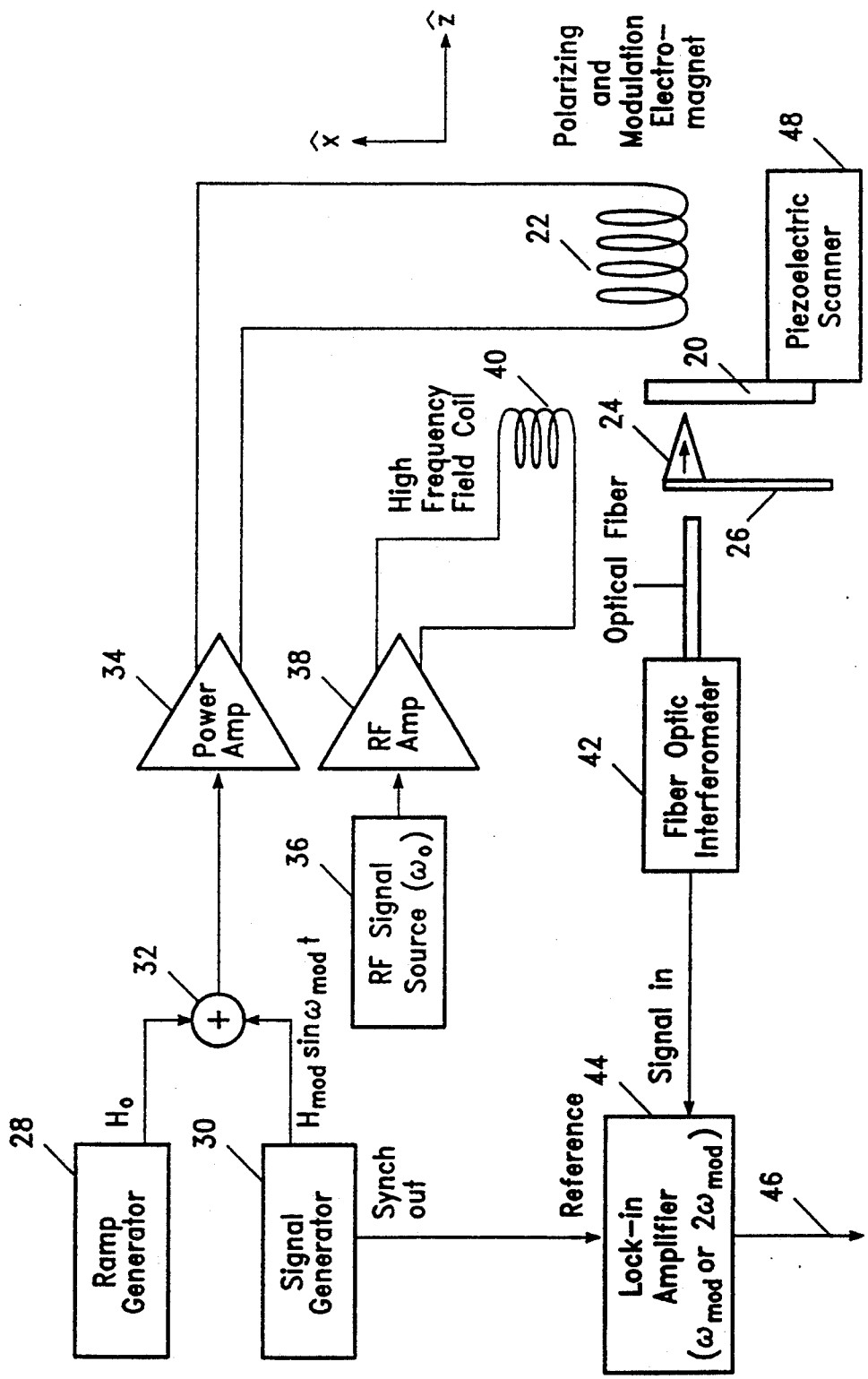
FIG. 4 is a schematic diagram of apparatus for detecting modulation of z-axis magnetization $M_z$ by modulating the polarizing field $H_z$ on the sample.

FIG. 4 depicts one embodiment, according to the invention, of an apparatus for detecting modulation of a z-axis sample magnetization $M_z$ which results from modulating the polarizing field $H_z$. Sample 20 is polarized in the z direction by magnetic fields from an electromagnet 22 and the magnetized tip 24 of a mechanical cantilever 26. The magnetic field strength from electromagnet 22 is determined by the sum of signals from a ramp generator 28 and a modulation signal generator 30 that are added at 32 and amplified at 34.

Ramp generator 28 permits the overall magnetic field $M_z$ to be set to a specific value or periodically varied for imaging or to perform magnetic resonance spectroscopy. Signal generator 30 periodically modulates the polarizing field $H_z$ with an angular frequency $\omega_{mod}$.

Generator 36 generates a high-frequency signal with an angular frequency $\omega_0$. This signal is amplified by an amplifier 38 to drive a high-frequency coil 40 for generating an oscillating high-frequency magnetic field. This high-frequency magnetic field excites spins in sample 20 when the excitation frequency is equal to the spin resonance frequency. This occurs when $\omega_0 = \gamma H_z$, where $H_z$ is the strength of the polarizing magnetic field and $\gamma$ is the gyromagnetic ratio of the spins. This combination of high-frequency excitation of the spins and modulation of the polarizing field $H_z$ results in periodic modulation of the magnetization of sample 20 in the polarizing field direction (i.e., the z direction).

The magnetized tip 24 on cantilever 26 creates a magnetic field gradient (i.e., a nonuniform magnetic field) which in combination with the periodic modulation of the sample magnetization generates a periodic force on the cantilever that causes it to vibrate. A fiber optic interferometer 42 senses this vibration and generates a signal that is synchronously detected with a lock-in amplifier 44 that receives a reference signal from generator 30. amplifier 44 can be tuned to detect vibrations occurring at the first harmonic of the modulation frequency $\omega_{mod}$ (or, as earlier noted, preferably at the second harmonic $2\omega_{mod}$) and provide an appropriate output signal in line 46 that corresponds to the oscillation amplitude of cantilever 26.

A piezoelectric scanner 48 is preferably included that can move sample 20 relative to the magnetized tip 24 in two or three dimensions to obtain a vibration signal from different parts of the sample. From this vibration signal it is possible to generate in line 46 a signal corresponding to the spin density image of the sample.

Figure 5:
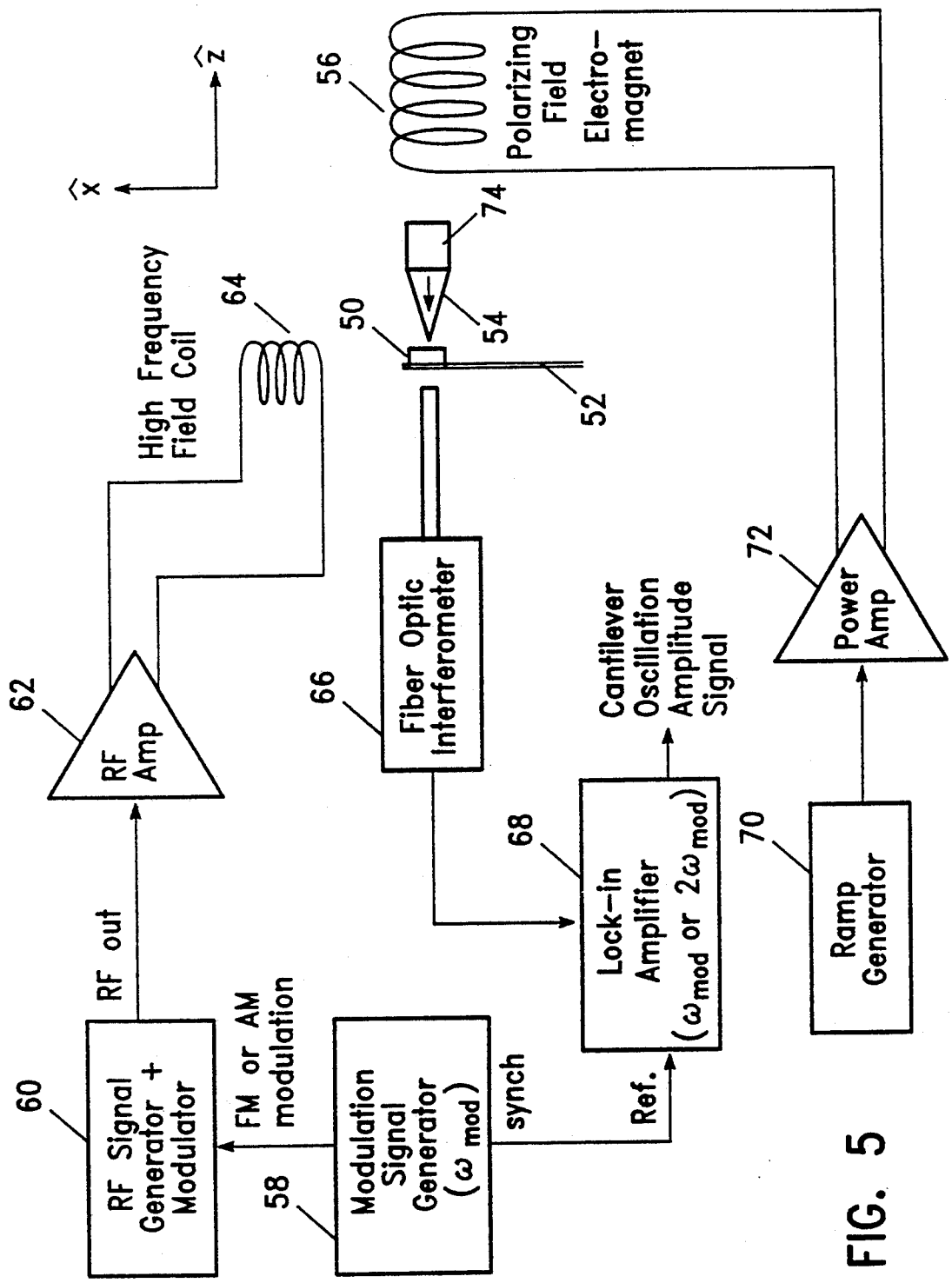
FIG. 5 is a schematic diagram of apparatus for detecting modulation of z-axis magnetization $M_z$ by modulating a high-frequency magnetic field $H_1$ applied at right angles to the polarizing field $H_z$.

FIG. 5 depicts another embodiment, according to the invention, of an apparatus for modulating the magnetic moment in the z direction by modulating the frequency or amplitude of the high-frequency magnetic field, rather than modulating the magnetic field as in FIG. 4. As illustrated in FIG. 5, this embodiment also differs in that a spin-containing sample 50 is mounted on low-damping-coefficient mechanical cantilever 52 and spaced in close proximity to a magnetic needle 54. Sample 50 is polarized in the z direction by magnetic fields from polarizing magnet 56 and needle 54. Modulation signal generator 58 generates a periodic signal at angular frequency $\omega_{mod}$. This periodic signal, in turn, as illustrated, modulates the frequency of a signal output by a high-frequency signal generator and modulator 60 via an amplifier 62 to a high-frequency coil 64.

Coil 64 excites spins in the sample 50 when the excitation frequency corresponds to the spin resonance frequency. Modulation of the high-frequency field causes the magnetic moment $M_z$ in sample 50 to vary periodically with frequency components at $\omega_{mod}$ (or preferably $2\omega_{mod}$). The magnetic field gradient created by needle 54 exerts a force on sample 50 proportional of the magnetization $M_z$.

Since $M_z$ varies periodically as a result of modulation of the high-frequency field, the force exerted on the cantilever 52 will also vary and cause the cantilever to vibrate. This vibration, as sensed by a fiber optic interferometer 66, is synchronously detected by a lock-in amplifier 68 which receives a reference signal from generator 58. Amplifier 68 is tuned to detect cantilever vibration signals at the first harmonic $\omega_{mod}$, or preferably, the second harmonic $2\omega_{mod}$, of the modulation frequency.

The polarizing field of magnet 56 can be varied by a signal from a ramp generator 70 as amplified by a power amplifier 72. This will change the spin resonance frequency according to the relation $\omega_0 = \gamma H_z$.

With needle 54 mounted on a piezoelectric scanner 74, the needle can be moved relative to the sample 50 and select locations of spins in the sample that are resonant with the high-frequency field. By scanning needle 54 in a raster pattern, a microscopic image of the spin density can be generated. As illustrated in FIG. 5, signal generator 60 modulates the magnetic moment by modulating the frequency of the high-frequency magnetic field. It will be understood that, if preferred, it may modulate the magnetic moment by modulating the amplitude of the high-frequency magnetic field.

While the invention has been particularly shown and described with reference to preferred embodiments thereof, it will be understood by those skilled in the art that various changes in form and details may be made therein without departing from the spirit and scope of the invention. Accordingly, the methods and apparatus herein disclosed are to be considered merely as illustrative and the invention is to be limited only as specified in the claims.

We claim:

1. An apparatus for detecting magnetic resonance effects in a material containing magnetic spins having a spin resonance frequency, said apparatus comprising:
    means for polarizing the spins to create a magnetic moment in the direction of a polarizing magnetic field in the material;
    means for applying a high-frequency magnetic field to the material at a frequency substantially equal to the spin resonance frequency;
    means for creating a magnetic field gradient to which the material is subjected to exert a force between the material and field gradient creating means;
    a mechanical oscillator;
    the material and field gradient creating means being spaced in close proximity, with one of them being mounted on the oscillator;
    means for modulating the magnetic moment at a frequency $\omega_{mod}$ which is substantially lower than the spin resonance frequency to create a mechanical force that vibrates the oscillator at a frequency substantially lower than the spin resonance frequency; and
    means for detecting motion of the oscillator.

2. The apparatus of claim 1, including means for mechanically scanning the material relative to the field gradient creating means to image spin resonance properties of the material.

3. The apparatus of claim 1, wherein said modulating means periodically varies the amplitude of the high-frequency magnetic field.

4. The apparatus of claim 1, wherein said modulating means periodically varies the frequency of the high-frequency magnetic field.

5. The apparatus of claim 1, wherein said modulating means applies to the material a time-varying magnetic field in the direction of the polarizing field.

6. The apparatus of claim 1, wherein said modulating means applies the high-frequency magnetic field suddenly so as to induce transient nutation of said magnetic moment.

7. The apparatus of claim 1, wherein said modulating means periodically pulses the high-frequency magnetic field for periodically reversing the direction of the magnetic moment.

8. The apparatus of claim 1, wherein the frequency of vibration of the oscillator is substantially equal to the modulation frequency $\omega_{mod}$.

9. The apparatus of claim 1, wherein the frequency of vibration of the oscillator is substantially equal to an integer multiple of the modulation frequency $\omega_{mod}$.

10. The apparatus of claim 1, wherein the frequency of vibration of the oscillator is substantially equal to its mechanical resonant frequency.

11. The apparatus of claim 1, wherein said mechanical oscillator is a micromechanical cantilever with low damping coefficient.

12. The apparatus of claim 1, wherein the magnetic spins are due to electrons in the material such that the material exhibits paramagnetic, ferromagnetic, ferrimagnetic or antiferromagnetic spin resonance properties.

13. The apparatus of claim 1, wherein the magnetic spins are nuclei in the material, and the material exhibits nuclear magnetic resonance or nuclear quadrupole resonance properties.

14. A method for detecting magnetic resonance in a material containing magnetic spins, said method comprising the steps of:
    providing a magnetic particle in close proximity to the material for subjecting the material to a magnetic field gradient for generating a magnetic force;
    mounting either the material or the magnetic particle on a mechanical oscillator;
    polarizing the spins in the material to create a magnetic moment in the material;
    applying to the material a high-frequency magnetic field substantially equal to a frequency $\omega_0$ at which the spins resonate in the material;
    modulating the magnetic moment of the material at a frequency $\omega_{mod}$ which is substantially lower than the frequency $\omega_0$ to create a mechanical force that acts on the oscillator and varies with a frequency substantially lower than the frequency $\omega_0$; and
    detecting motion of the oscillator.

15. The method of claim 14, including periodically varying the amplitude of the high-frequency magnetic field during the modulating step.

16. The method of claim 14, including periodically varying the frequency of the high-frequency magnetic field during the modulating step.

17. The method of claim 14, including applying a time-varying magnetic field in the material during the modulating step.

18. The method of claim 14, including, during the applying step, applying the high-frequency magnetic field suddenly so as to induce transient nutation of said magnetic moment.

19. The method of claim 14, including, during the modulating step, pulsing the high-frequency magnetic field so as to periodically reverse the direction of the magnetic moment.

20. The method of claim 14, including, during the modulating step, vibrating the oscillator at a frequency substantially equal to an integer multiple of the modulation frequency $\omega_{mod}$.

21. The method of claim 14, including, during the modulating step, vibrating the oscillator at a frequency substantially equal to its mechanical resonant frequency.

22. The method of claim 14, using as the mechanical oscillator a micromechanical cantilever with low damping coefficient.

23. The method of claim 14, including using as the material one exhibiting paramagnetic, ferromagnetic, ferrimagnetic or antiferromagnetic spin resonance properties.

24. The method of claim 14, including using as the material one exhibiting nuclear magnetic resonance or nuclear quadrupole resonance properties.

25. The method of claim 14, including the step of mechanically scanning the material with respect to the magnetic particle for imaging spin resonance properties of the material.

* * * * *